United States Patent [19]
Chan et al.

[11] Patent Number: 5,793,618
[45] Date of Patent: Aug. 11, 1998

[54] MODULE MOUNTING ASSEMBLY

[75] Inventors: Benson Chan, Vestal, N.Y.; Robert William Nesky, Nicholson, Pa.

[73] Assignee: International Business Machines Corporation, Armonk, N.Y.

[21] Appl. No.: 753,586

[22] Filed: Nov. 26, 1996

[51] Int. Cl.⁶ .................................................. H01R 13/629
[52] U.S. Cl. .................. 361/809; 361/768; 361/769; 439/66; 439/73; 439/331; 257/726; 257/727
[58] Field of Search ..................... 361/718, 719, 361/726, 727, 736, 767, 769, 809, 768; 439/66, 70, 71, 73, 331; 257/718, 726, 727

[56] References Cited

U.S. PATENT DOCUMENTS

| | | | |
|---|---|---|---|
| 4,357,061 | 11/1982 | Crosby | 439/66 |
| 4,770,641 | 9/1988 | Rowlette | 439/86 |
| 5,147,209 | 9/1992 | Litwin et al. | 439/70 |
| 5,163,837 | 11/1992 | Rowlette, Sr. | 439/91 |
| 5,259,781 | 11/1993 | Baumberger et al. | 439/66 |
| 5,334,029 | 8/1994 | Akkapeddi et al. | 439/66 |
| 5,468,158 | 11/1995 | Roebuck et al. | 439/264 |
| 5,473,510 | 12/1995 | Dozier, II | 361/719 |

*Primary Examiner*—Leo P. Picard
*Assistant Examiner*—John B. Vigushin
*Attorney, Agent, or Firm*—Calfee, Halter & Griswold LLP

[57] ABSTRACT

A technique for applying uniform force to an IC chip module, urging the module into electrical contact with one face of a circuit board, is provided. One face of the board has contact pads, and the module has contact members on one surface corresponding to the contact pads. A first clamping member is provided having a pressure applying section and a reaction section mounted for movement toward and away from each other. A second clamping member having a pressure applying section is provided. The module is interposed between the pressure applying element of one of the clamping members and the substrate with the contact members on the module in electrical contact with the pads on the board. Several pins interconnect the reaction section of the first clamping member and the second clamping member to restrain movement of the reaction section of the first clamping member away from the second clamping member. At least one biasing member, preferably including a belville washer, is interposed between the reaction section and the pressure applying section of the first clamping member urging the reaction section and the force applying section away from each other to thereby exert force against the module urging it into electrical connection with the pads on the board. Also, preferably a locator is provided to locate the planar element, and an interposer is provided between the contacts on the planar element and the contacts on the substrate. The interposer has vias terminated at both ends in dendrites.

28 Claims, 6 Drawing Sheets

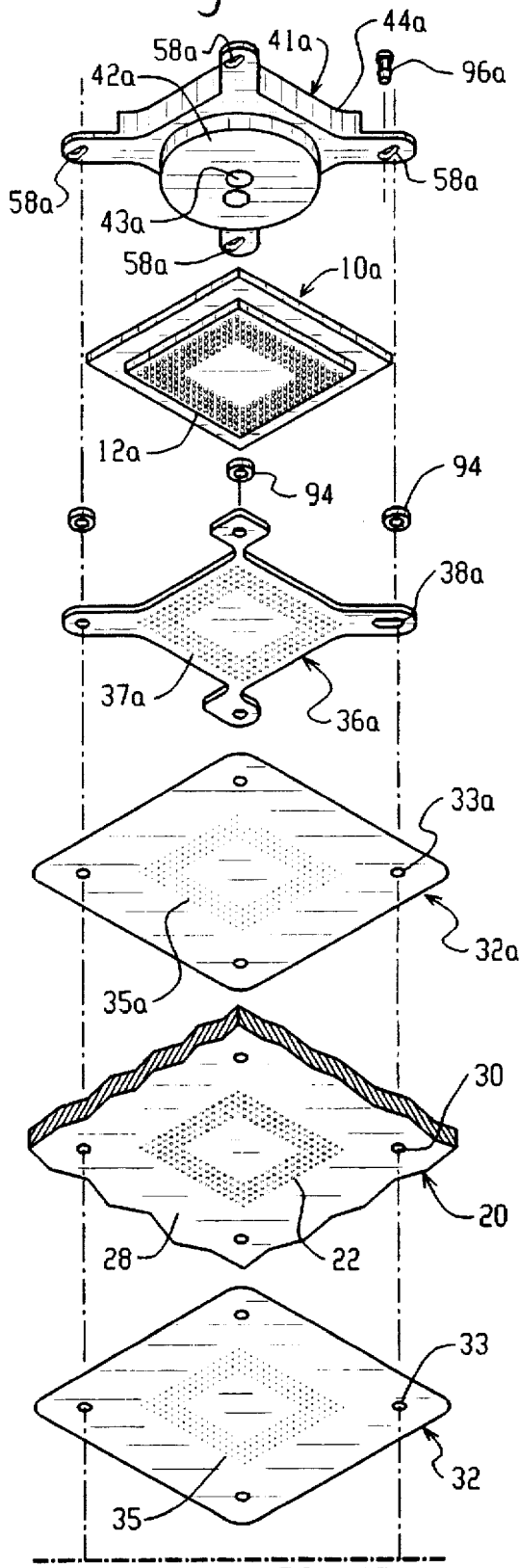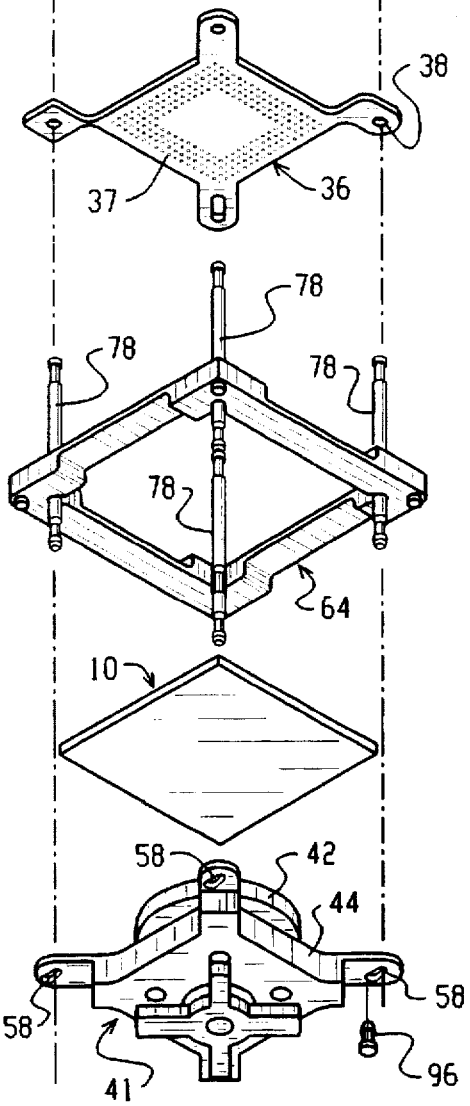
Fig. 1A
Fig. 1B

MODULE MOUNTING ASSEMBLY

RELATED APPLICATION application Ser. No. 08/525,861 filed Sep. 8, 1995, entitled "Method and Apparatus for Locating Electrical Circuit Members" (Attorney Docket No. EN9-95-007).

1. Field of the Invention

This invention relates generally to the mounting of integrated circuit (IC) modules to substrates such as circuit boards or cards, and more particularly to mechanically mounting IC modules to circuit boards or cards without the need of solder reflow interconnections.

2. Background Information

In the technology of mounting modules to substrates such as circuit boards and circuit cards, one conventional technique employed is by the use of liquid solder reflow to connect the modules to the substrate. (Modules conventionally have one or more circuit chips mounted on a chip carrier.) The carrier is mounted to the circuit board or card. The technique of using solder reflow for connecting the module to the card or board has certain limitations. One such limitation is imposed where the material of which the circuit card or board is formed is not amenable to the temperatures required for solder reflow, such as polytetrafluoroethylene (PTFE), thus requiring technology other than solder reflow. Another instance where solder reflow is difficult or impractical is for the mounting of modules on opposite sides of the substrate. Moreover, there are significant problems of soldering modules larger than about 42 mm to certain substrates because of the mismatch of the thermal coefficients of expansion. After the components are soldered to one side and then the components are attempted to be soldered to the other side, the heat from the soldering on the second side can cause loosening of the connections or separation of the modules soldered to the first side.

Therefore, there is a need in many cases to provide accurate, reliable connections of a module to a substrate, which technique is applicable to connecting modules to opposite sides of the substrate, with the resulting connection being strong and able to withstand many years of service in commercial products. Thus, a strong bond and good electrical connection between the modules and the substrate must be maintained over a period of time under repeated thermal stresses and mechanical stresses and which will not deteriorate or become unreliable due to chemical action.

SUMMARY OF THE INVENTION

A device for applying uniform force to at least one planar element, such as an IC chip module, urging the planar element into electrical contact with one face of a substrate having first and second opposite faces, such as a circuit board, is provided. One face of the substrate has contact pads thereon, and the planar element has contact members on one surface thereof corresponding to the contact pads on the substrate and an opposite surface.

A first clamping member is provided having a pressure applying section and a reaction section mounted for movement toward and away from each other. A second clamping member having a pressure applying section is provided. The module is interposed between the pressure applying element of one of the clamping members and the substrate with the contact members on the module in electrical contact with the pads on the board. At lest one connection member interconnects the reaction section of the first clamping member and the second clamping member to restrain movement of the reaction section of the first clamping member away from the second clamping member. At least one biasing member, preferably including a belville washer, is interposed between the reaction section and the pressure applying section of the first clamping member urging the reaction section and the force applying section away from each other to thereby exert a force against the planar element urging it into electrical connection with the pads on the substrate. Also, preferably a locator is provided to locate the planar element, and an interposer is provided between the contacts on the planar element and the contacts on the substrate. The interposer has vias terminated at both ends in dendrites.

DESCRIPTION OF THE DRAWINGS

FIGS. 1A and 1B together are a perspective exploded view of the clamping device of the present invention showing its position with respect to a pair of modules to be clamped to opposite sides of a circuit board;

DESCRIPTION OF THE PREFERRED EMBODIMENT

Figure 2:
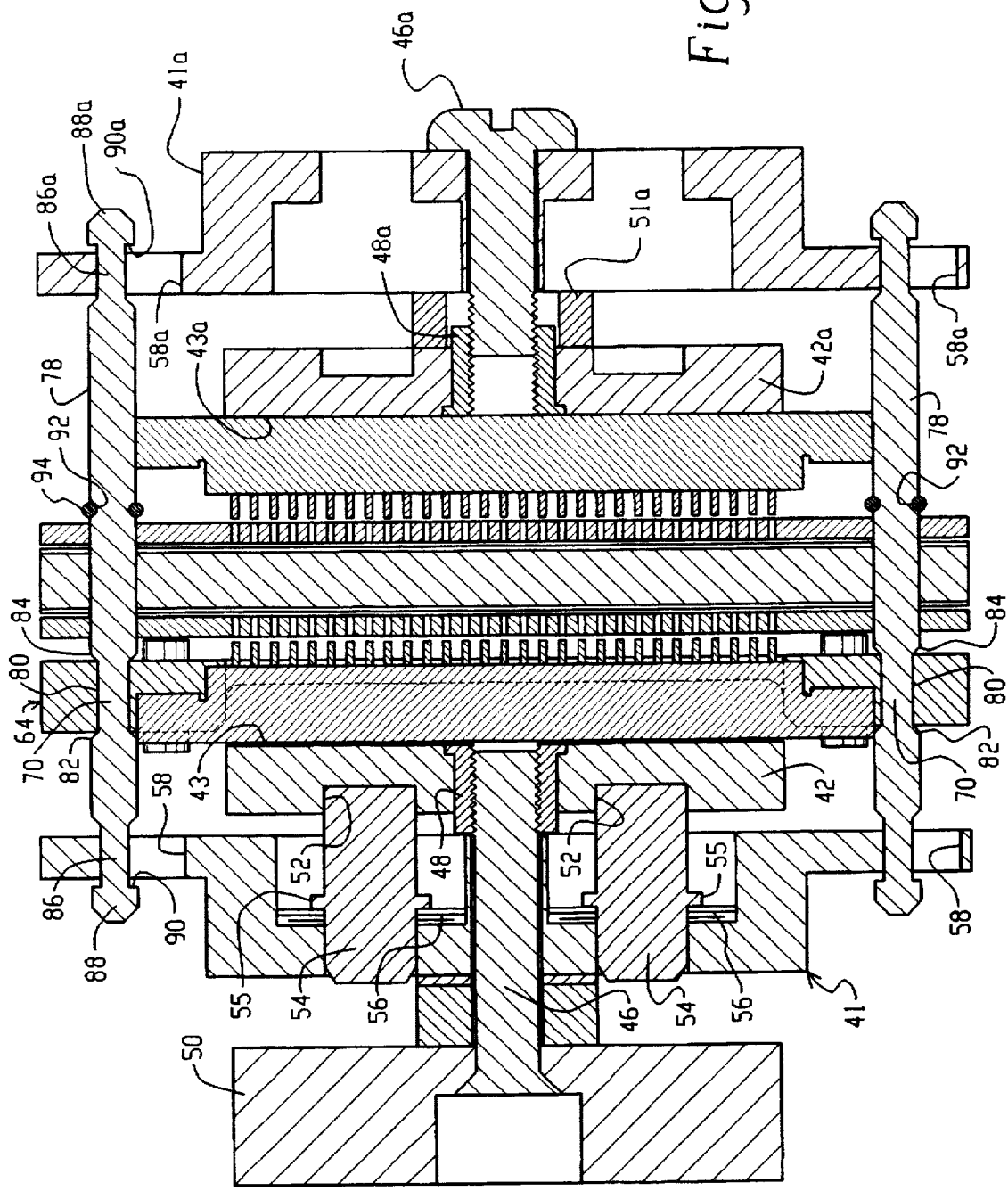
FIG. 2 is a sectional view of the clamping device assembled for clamping, but before pressure has been exerted with the spacing of some of the components somewhat exaggerated for illustrative purposes.

Referring now to the drawings, one embodiment of a clamping device of the present invention is shown for clamping integrated circuit (IC) chip modules to opposite sides of the circuit board. In this embodiment, the modules contain an integrated circuit chip and use solder column technology for attaching the modules to the circuit board or circuit card. It is to be understood that the invention can take other forms, i.e., it can be used to clamp modules utilizing solder ball technology rather than solder column technology to opposite sides of the circuit card, and also can be used to clamp a module to only one side of the circuit card or circuit board, all as will be explained presently. This invention can also be used with a land grid array to gold pads without the use of solder.

Referring now to the drawings, and for the present to FIGS. 1-4, a device is provided which will attach a pair of modules 10 and 10a to opposite sides of a circuit board or circuit card 20. Each of the modules 10 and 10a has a contact face 12 and 12a and an opposed face 14 and 14a. Solder columns 16 and 16a extend respectively from the contact faces 12 and 12a of the modules and provide for the electrical contact necessary for transmission of the I/O signals to and from the modules. As described above, the modules contain one or more IC chips (not shown) disposed in a conventional manner on a carrier with some type of cover. The specific configuration of the module is unimportant, provided that the module has solder ball or solder column interconnections or land grid array of gold pads, or other pressure type connections on one face and an essentially planar opposite face for applying pressure thereto.

The modules 10 and 10a are to be applied to opposite sides of the circuit board or circuit card 20 with the column 16 and 16a in electrical contact with contacts 22 on one face 24 thereof and contacts 26 on the opposite face 28 thereof, respectively. The contacts 22 are in the same pattern as the columns 16 on the module 10 and the contacts 26 on face 28 are in the same pattern as the solder columns 16a and the module 10a. It should be understood that these can be the same pattern or different patterns for the modules 10 and 10a, the only requirement being that the contacts 12 and 12a match the contacts 22 and 26, respectively. The circuit board 20 also has a plurality of through openings 30, the purpose of which will be described presently.

In the preferred embodiment, the electrical connections of the solder columns 16 and 16a with the contacts 22 and 26 is made through flexible interposers 32 and 32a, such as IBM Flexiposer®, respectively. The flexible interposers 32 and 32a have circumferentially spaced openings 33 and 33a which, one of each of which may be slightly elongated to facilitate assembly. The interposers 32 and 32a have formed therein vias 34 and 34a respectively filled with conducting material extending from one face to the other, which vias 34 and 34a terminate at opposite faces of the interposer with dendrites 35. Flexible interposers, such as the IBM Flexiposer®, are well known in the art, and the technique of forming dendrites is described in commonly designed U.S. Pat. No. 5,137,461. It is to be understood that this is the preferred embodiment of making strong connections, i.e., the use of flexible interposers with filled vias having dendrites at opposite ends thereof. However, other techniques, such as "fuzz button technology," can be used. (Also, in certain applications, such as prototyping or testing the use of the interposer may be eliminated and the contact made directly between the solder columns 16, 16a and contacts 22 and 26, respectively.)

To position and support the solder columns 16 and 16a, a pair of module locator assemblies 36 and 36a are provided. The module locator assemblies each have through openings 37 and 37a which are arranged in the pattern of the solder columns 16 and 16a, respectively, and have through openings 38 and 38a circumferentially spaced thereon, aligned with the openings 30 extending through the circuit board 20. One of each of the openings 38 and 38a can be slightly enlarged to facilitate assembly. The flexible interposers 32 and 32a, respectively, are interposed between one locator assembly 36 or 36a and one face 24 or 28 of circuit board 20. The openings 33, 33a are in alignment with the openings 30 of circuit board 20 and openings 38, 38a of modules locator assemblies 36, 36a.

The module locating assemblies 36, 36a each have contact faces 39 and 39a contacting flexible interposers 32 and 32a, respectively, and opposite faces 40 and 40a directed outwardly away from the circuit board and in proximity with the contact faces 12 and 12a of the modules 10 and 10a respectively.

A pair of clamping members 41 and 41a are provided to provide the clamping force to clamp the modules 10, 10a to the circuit board 20. The clamping member 41 is an actuating or actual clamping member, and the clamping member 41a is a "dummy" or passive clamping member. Each of the clamping members includes a pressure section 42 and 42a, having pressure faces 43 and 43a contacting respectively the opposed faces 14 and 14a of the modules 10 and 10a. The clamping members 41 and 41a also have respectively reaction sections 44 and 44a, each of which are provided with screw members 46 and 46a which threadably engage threaded bushings 48 and 48a in the pressure sections 42 and 42a, respectively. The screw 46 is provided with a handle 50 which can be used to detach the screw 46 as will be described presently. Clamping member 41a has a spacer ring 51a which is used to maintain the reaction section 44a and pressure section 42a the desired distance apart depending upon the thickness of the module 10, 10a.

Figure 3:
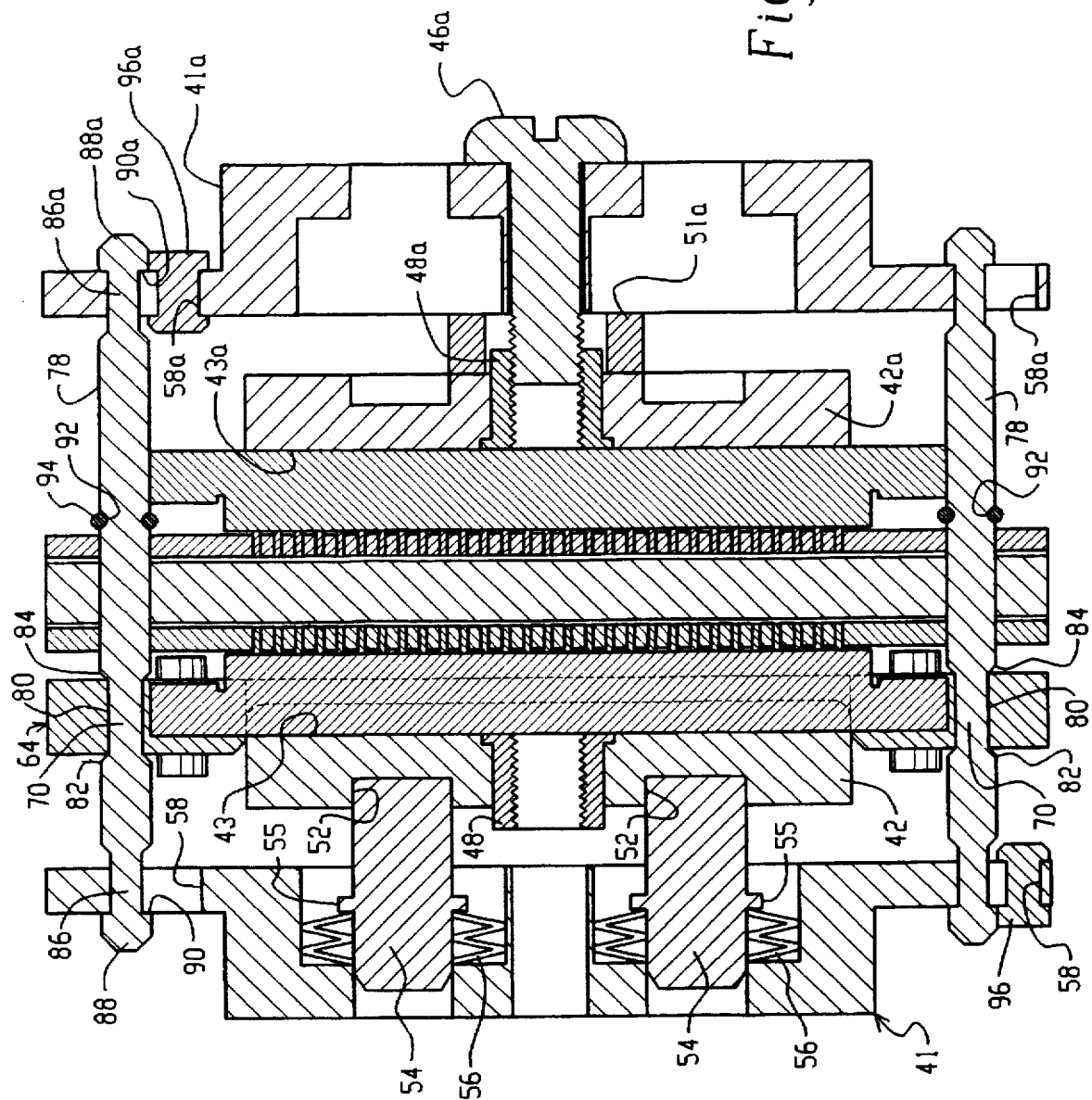
FIG. 3 is a sectional view, similar to FIG. 2, showing the clamping device after pressure has been exerted against the modules clamping them onto the circuit board.
Figure 4:
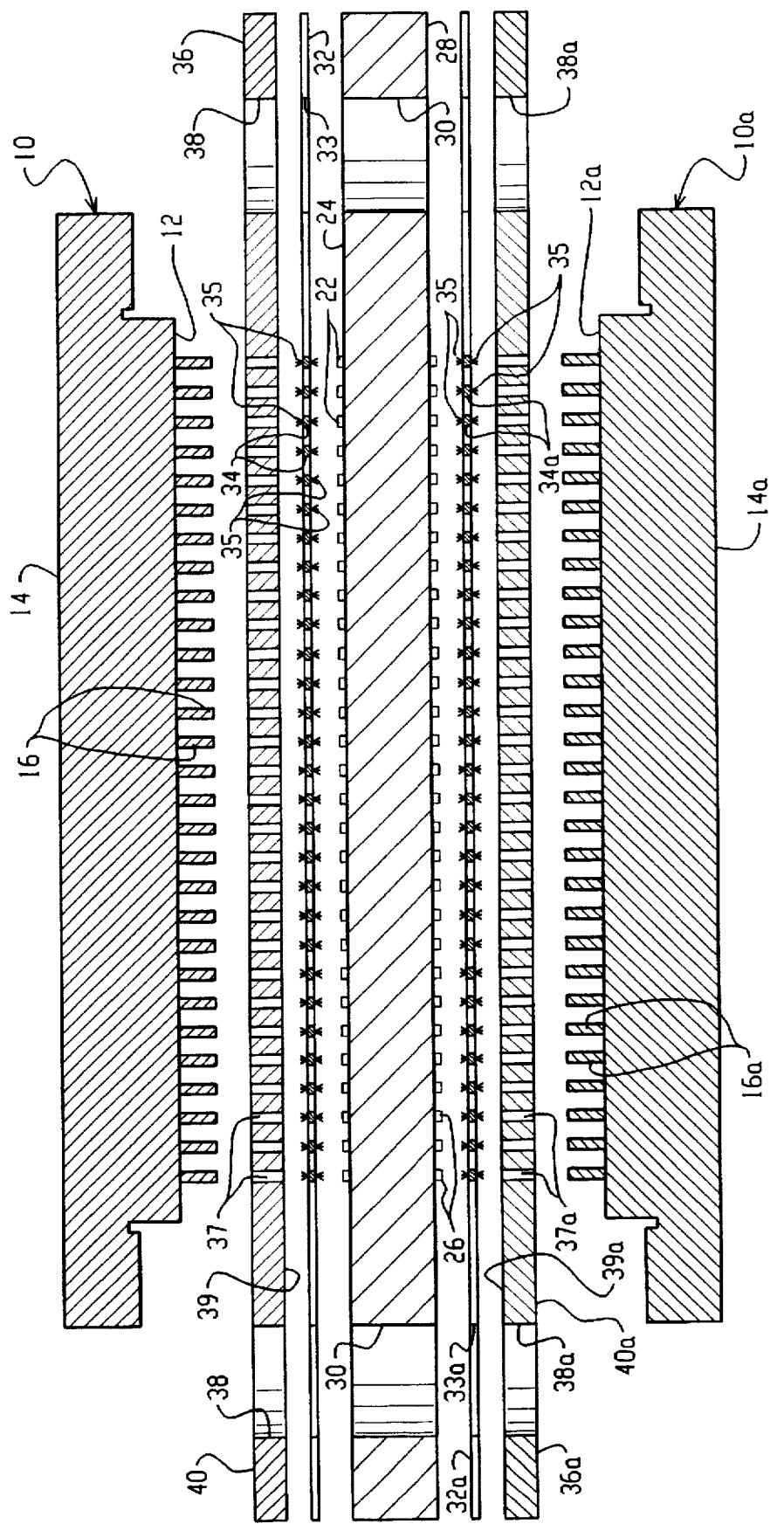
FIG. 4 is an exploded detailed longitudinal sectional view of the interconnection of the modules to the substrate.

With respect to the clamping member 41, there are four circumferentially bottomed bores 52 (two of which are shown in FIGS. 2 and 3) formed in the reaction section 44. Four circumferentially-spaced guide posts 54 (two of which are shown in FIGS. 2 and 3) are disposed within the bottomed bores 52 in the reaction section 44 with each of the guide posts having a shoulder 55 formed thereon. Belville washers 56 are interposed between the shoulders 55 and the bottom of the bores 52 urging the guide posts 54 into bottomed bores 52. The reaction sections 41 and 41a each have circumferentially-spaced keyhole shaped slots 58, 58a.

Figure 5:
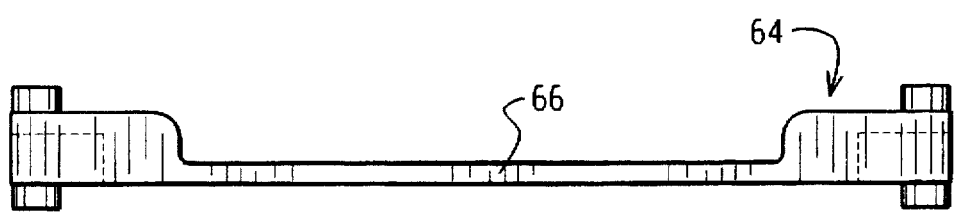
FIG. 5 is a side elevational view of the frame member of the guides.
Figure 6:
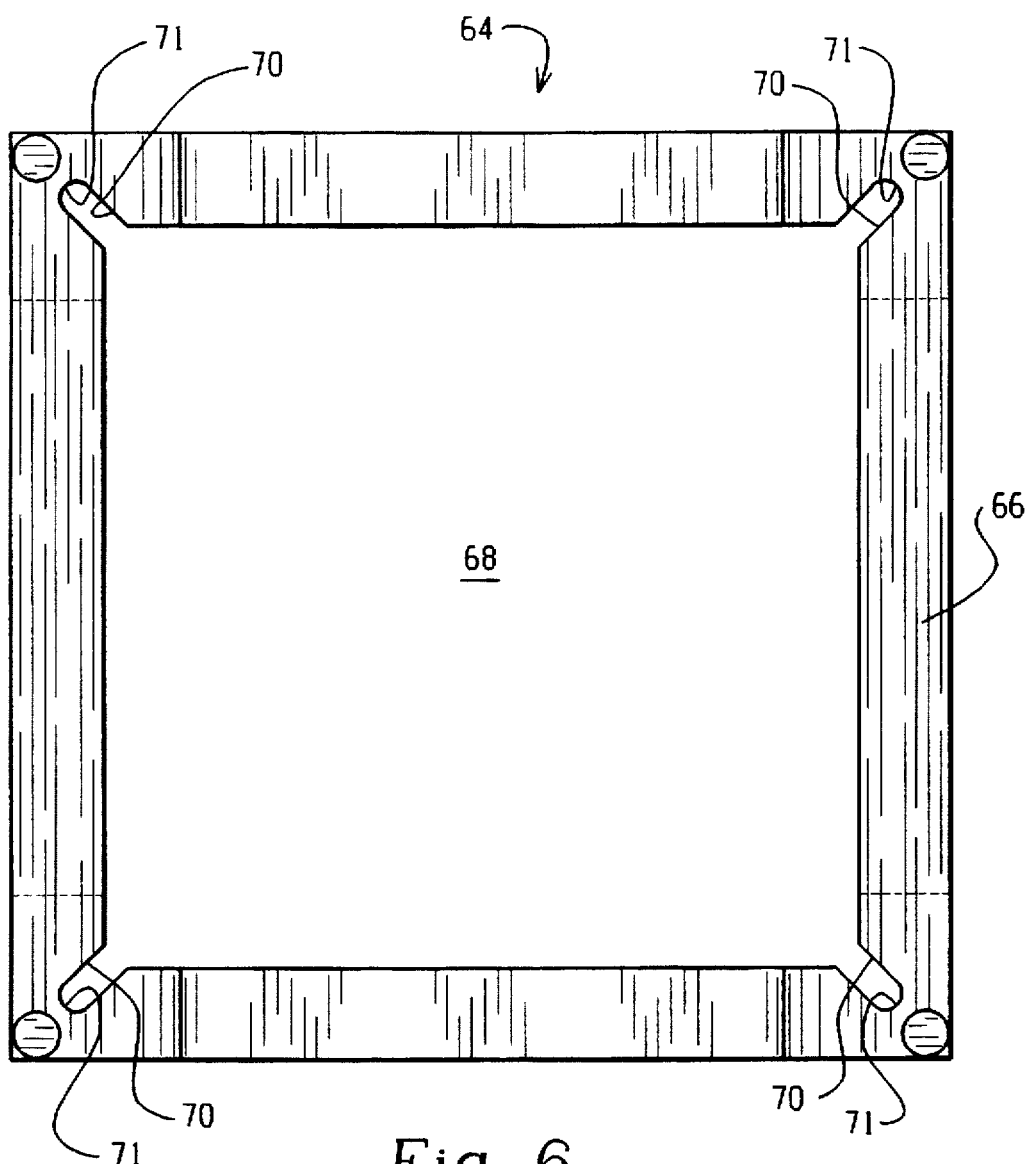
FIG. 6 is a plan view of the frame of FIG. 5.

In order to assist in assembling the clamping device onto the modules and securing them to the circuit board, a guide member 64 (which is shown in more detail in FIGS. 5 and 6) is provided which has a square-shaped frame 66 defining a central opening 68. The frame 66 has four circumferentially-spaced grooves 70 which terminate in semicircular end portions 71 which correspond in location to the through openings 30 and openings 38 and 38a and opening 33 and 33a. The entire clamping assembly, including the guide 64 is mounted on four alignment pins 78. The alignment pins 78 each have a reduced central diameter 80 which is disposed in one of the end portions 71 of the slots 70 of the guide 64 and are defined at opposite ends by shoulders 82 and 84 which restrain the guide 64 from axial movement on the pins 78. The pins 78 also have reduced diameters 86 and 86a at opposite ends thereof which terminate at the end knobs 88 and 88a respectively, defining shoulders 90 and 90a at the end knobs 88 and 88a. The pins 78 also each have grooves 92 in which O-rings 94 are disposed and which are used during the assembly of the clamping device as will be explained presently. A pair of plugs, 96, 96a are provided, one at each end which insert into the large portion of one of the slots 58 and 58a to prevent unintentional disengagement as will be described presently.

Before explaining in detail the assembly of the clamping device to urge the modules to force electrical contact with the circuit board, a brief explanation of the operation of the clamping device will be helpful in understanding the assembly of the device. When the assembly is put in place, the handle 50 is utilized to tighten the screw member 46 to put the belville washers 56 into compression by urging the reaction section 44 toward the pressure section 42 of the clamping member 41. In this position, as shown in FIG. 2, at which there is a very loose fit of all of the components with no pressure exerted since the pressure section 42 is retracted close to the reaction section 44, thus allowing a loose fit of the components between the pressure sections 42 and 42a. After the components are assembled in the position as shown in FIG. 2 (the assembly of which will be described presently), the handle 50 is used to remove the screw 46 from the clamping member 41. This relieves the constraint or pressure on the belville washers 56, the action of which causes the reaction section 44 to be urged away from the pressure section 42 of the clamping member 41. (It should be noted that the screw member 46a is maintained in place and not removed and thus spacer ring 51a maintains the sections 42a and 44a the desired distance apart.) When the restraint on the movement of the pressure section 42 with respect to the reaction section 44 is removed, the pressure section 42 is urged toward the module 10 and engages the opposed face 14 thereof. However, the action of the reaction sections 44 and 44a and the alignment pins 78 restrains the movement of the clamping members 41 and 41a axially apart. This causes force to be exerted through the pressure sections 42 and 42a of the clamping members against the opposed faces 14 and 14a of the modules 10 and 10a, thus putting pressure or force on the modules 10, 10a urging them into contact with the dendrites 36 and 36a on the flexible interposers 32 and 32a. This urges the vias 34, 34a of the interposers 32, 32a into contact with the contacts 22 and 26, respectively, on board 20. The dendrites 45 cause a solid electrical connection to be formed between the solder columns 16 and 16a and the contacts 22 and 26 on the circuit board through the filled vias 34 and 34a of the flexible interposers 32 and 32a, respectively. This force is generated by means of the action of the belville washers 56 and remains essentially constant throughout the life of the part, thus making this connection a very reliable connection when the device is assembled. This force is a function of the size of the belville washer and the spacing of the sections 42a and 44a as set by spacer ring 51a and maintained in place by screw 46a threaded in bushing 48a. The force exerted by the clamping members 41 and 41a can be adjusted by changing the thickness of spacer 51a and then using the screw 46a to adjust the position of the pressure section 42a with respect to the reaction section 44a against spacer 51a.

The assembly of the device on board 20 is as follows. First, the reduced central diameter portion 80 of the alignment pins 78 are inserted to grooves 70 of guide member 64. The grooves 70 are sized to be slightly smaller than the diameter 80, but have arcuate end portions 71 slightly larger than diameter 80. This allows the frame 66 to float on the pins without disengagement. A subassembly of a locator and interposer is put on the pins 78. This can be either locator 36 and flexible interposer 32, or locator 36a and interposer 32a. In assembling this subassembly of the locator and interposer, the interposer must be located facing toward the direction of the card 20. Thereafter, the four pins 78 are inserted through he holes 30 in the card 20, and a subassembly of the other locator and interposer is then put on the pins with the interposer positioned between the locator and the card 20. The O-rings 94 are then applied to hold the assembly together. After this, the modules 10 and 10a are inserted into the respective locators 36 and 36a. At this point, the clamping members 41 and 41a are attached one side at a time. Either side may be attached first. It should be noted that in assembly position the screw 46 is tightened so as to draw the pressure applying section 42 toward the reaction section 44, comprising compressing the belville washers 56 as shown in FIG. 2. The clamping sections are mounted on the reduced end diameter portions 36 of the alignment pins 78. This is done by inserting the knob ends of the actuating pins 78 through the enlarged portions of the slots 58 and 58a in the pressure sections 42 and 42a, and then each of the actuator clamp assemblies 41 and 41a are slid to move the pins into the reduced size portions of the slots 58 and 58a. In order to maintain the pins in the reduced diameter section, plugs 96 and 96a are inserted into the large end of one of each of the slots 58 and 58a to prevent unintended disengagement.

Once the two clamping members 41 and 41a are in place with the modules 10 and 10a and flexible interposers 36 and 36a in the relationship as described, the handle 50 is rotated to remove the screw 46 from the bushing 48 in the pressure section 42. When the screw 46 has been removed, the pressure section 42 and reaction section 44 of the actuating clamping member are free to move axially relative to each and the action of the belville washers 56 will drive the pressure section 42 into contact with the opposite face 14 of module 10. The same action, however, will drive the reaction section 44 against the shoulders 90 of alignment pins 78 and this constraint action will then drive the entire assembly toward the right as seen in FIGS. 2 and 3 on alignment pins 78 causing the reaction section 44a of clamping member 41a to abut shoulder 90a on pin 78. The assembly at this point is firmly secured on the circuit board and with the pressure exerted the connections will be maintained in good electrical contact over the life of the board.

If at some point a problem with one of the modules is encountered, the assembly can be easily partially disassembled, the particular module which has the problem can be removed and replaced with another module, and the assembly reassembled. This disassembly is essentially the reverse of the assembly, in that the handle 50 is rotated to cause the screw 46 to tighten into bushing 48 to cause the reaction section 44 and pressure section 42 of the clamping member 41 to come together in essentially the position which is used to assemble the modules. Depending on which module 10 or 10a is to be replaced, the plug 96, 96a is removed, and the appropriate clamping member 41 or 41a is removed. The defective module 10 or 10a is removed and replaced with another module, and reassembly takes place from this point on as described previously.

It should be noted that in the disclosed embodiment, the clamping member 41 is active, i.e., it contains the washer and associated structure to exert the force of both sides, and the clamping member 41a is passive, i.e., it does not have the washers. However, both clamping members 41 and 41a could be active, i.e., include the washers and associated mechanisms. However, this would add cost without any significant benefit in most cases. Thus, normally only one clamping member 41 is active and clamping member 41a is passive.

As indicated earlier, there are several different embodiments of the invention which are effective. For example, modules with solder balls rather than solder columns can be provided, in which case the module locating assemblies 36, 36a are modified to accommodate solder balls.

In another embodiment, the assembly can be used to attache a module to only one side of a board, in which case the assembly as described above is utilized wherein one side of the board and a module locating assembly, either 36 or 36a, depending on which side the modules are to be mounted is provided. On the other side a "dummy" assembly is provided; or, indeed, the actuator clamping assembly can be utilized with the reaction section 44 or 44a (depending on which side of the board does not have the module) against the circuit board or mother board. Alternatively, a "dummy" plate could be inserted therein in place of the module.

Figure 7:
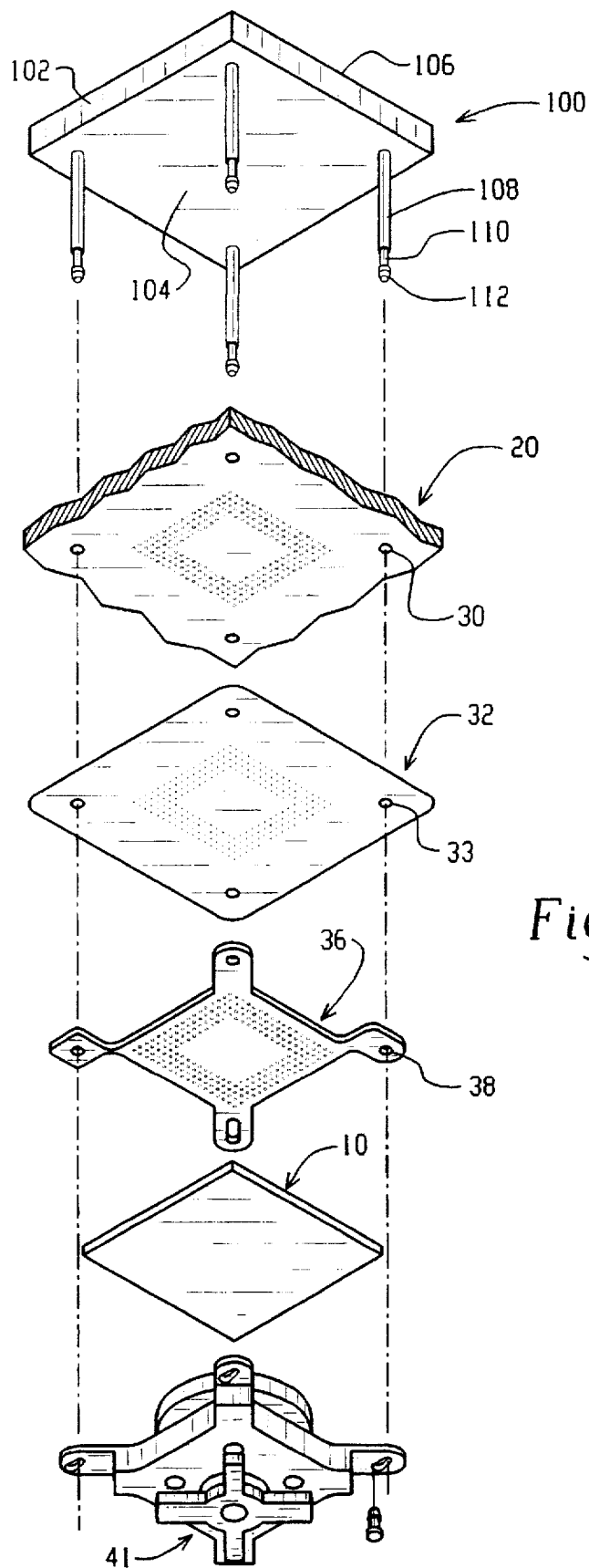
FIG. 7 is a perspective exploded view of another embodiment of the clamping device of this invention.

Another embodiment which is particularly adapted for use for single-sided module attachment (although it can be used for two sided attachment) is shown in FIG. 7. In this embodiment, the dummy clamping member 41 is replaced with a one-piece clamping member 100 which has a base 102 having a pressure exerting face 104 and an this case, the 106. In this case, the pressure exerting face 104 constitutes the pressure exerting section, and the opposite face 106 constitutes a reaction section, although structurally these two sections are integrated in the base member 102. Pins 78 of the previously described embodiments are replaced with pins 108 which are fixedly connected to the base 102 and project therefrom and which are provided with reduced diameter sections 110 terminating in knobs 112, similar to the construction of the ends of the pins 78 in the previously described embodiment. Since the pins 108 are fixedly connected to the base 102, a frame member of the type shown in the previous embodiment need not be used since the purpose of the frame member is to maintain the pins during assembly. The interconnection of this member 100 with the board and locator is the same as previously described with respect to the assembly for locating the module on one side, i.e., the module can be located either on the dummy side or on the active side of the card, the illustration in FIG. 7 showing the module and locator on the actuating side.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A device for applying uniform force to at least one planar element urging said planar element into electrical contact with one face of a substrate having first and second opposite faces, and wherein said one face of said substrate has contact pads thereon, and wherein said planar element has contact members on one surface thereof corresponding to the contact pads on the substrate and an opposite surface comprising:

a first clamping member having a pressure applying section and a reaction section mounted for movement toward and away from each other, a second clamping member having a pressure applying section and a reaction section, said at least one planar element being interposed between the pressure applying section of one of said clamping members and said substrate with the contact members on said planar element being in electrical contact with the pads on said substrate;

at least one connection member interconnecting said first and second clamping members to restrain movement of said reaction sections of said clamping members away from each other; and at least one biasing member interposed between said reaction section and said pressure applying section of said first clamping member using said reaction section and said pressure applying section away from each other to thereby exert a force against said planar element urging said planar element into electrical connection with the pads on the substrate.

2. The device of claim 1 further characterized by a mechanism connected between said pressure applying section and said reaction section of said first clamping member to selectively apply and remove said force against said planar element.

3. The device of claim 2 wherein said mechanism includes a removable screw for threadably urging said pressure applying section and said reaction section of said first clamping member to selectively move said sections relative to each other urging the bias of the at least one biasing member.

4. The device as defined in claim 1 wherein the contact members on said one surface of said at least one planar element are raised projections, and wherein a locator element is interposed between said substrate and said planar element, said locator element having openings therein corresponding to the said raised projections, and said raised projections projecting through said openings into electrical contact with the contact pads on said substrate.

5. The device as claimed in claim 4 wherein an interposer is provided between said locator element and said substrate, said interposer having through vias therein corresponding to said contact pads of said substrate and said contact members of said planar element to thereby provide the electrical connections therebetween.

6. The invention as defined in claim 4 wherein the raised projections are solder balls or solder columns.

7. The device as claimed in claim 6 wherein said vias terminate at at least one end in dendrites.

8. The invention as defined in claim 1 wherein there are planar elements on each side of said substrate.

9. The invention as defined in claim 5 wherein each planar element is an IC chip module.

10. The invention as defined in claim 1 wherein said at least one biasing member includes a belville washer.

11. The invention as defined in claim 1 wherein there are a plurality of circumferentially spaced biasing members.

12. The invention as defined in claim 11 wherein said biasing member includes a plurality of guide posts extending between said reaction section and said pressure applying section, and a force exerting device connected to said guide posts urging said reaction section and pressure applying section apart.

13. The invention as defined in claim 12 wherein said force exerting device includes belville washers.

14. The invention as defined in claim 1 wherein said reaction section and said pressure applying section of said second clamping member are interconnected by a fastener.

15. The invention as defined in claim 14 wherein a spacer member is interposed between said reaction section and said pressure applying section of said second clamping member.

16. The invention as defined in claim 1 wherein said reaction section and said pressure applying section of said second clamping member are rigidly interconnected.

17. A device for applying uniform force to at least one planar element urging said planar element into electrical contact with one face of a substrate having first and second opposite faces, and wherein said one face of said substrate has contact pads thereon, and wherein said planar element has contact members on one surface thereof corresponding to the contact pads on the substrate and an opposite surface comprising:

a first clamping member having a pressure applying section and a reaction section mounted for movement toward and away from each other, a second clamping member having a pressure applying section;

said at least one planar element being interposed between the pressure applying section of one of said clamping members and said substrate with the contact members on said planar element being in electrical contact with the pads on said substrate;

at least one connection member interconnecting said first and second clamping members to restrain movement of said second clamping member away from the reaction section of said first clamping member; and at least one biasing member interposed between said reaction section and said pressure applying section of said first clamping member using said reaction section and said pressure applying section away from each other to thereby exert a force against said planar element urging said planar element into electrical connection with the pads on the substrate.

18. The invention as defined in claim 17 wherein said at least one connection member includes at least one pin rigidly connected to said second clamping member.

19. The invention as defined in claim 18 wherein there are a plurality of circumferentially spaced pins connected to said second clamping member.

20. A method for applying uniform force to at least one planar element urging said planar element into electrical contact with one face of a substrate having first and second opposite faces, and wherein said one face of said substrate has contact pads thereon, and wherein said planar element has contact members on one surface thereof corresponding to the contact pads on the substrate and an opposite surface comprising the steps of;

providing a first clamping member having a pressure applying section and a reaction section mounted for movement toward and away from each other, providing a second clamping member having a pressure applying section and a reaction section, said at least one planar element being interposed between the pressure applying section of one of said clamping members and said substrate with the contact members on said planar element being in electrical contact with the pads on said substrate;

interconnecting said reaction sections of said first and second clamping members to restrain movement of said reaction sections of said clamping members away from each other; and biasing said reaction section and said pressure applying section of said first clamping member away from each other by at least one biasing member to thereby exert a force against said planar element urging said planar element into electrical connection with the pads on the substrate.

21. The method of claim 20 further characterized by a removable screw for threadably urging said pressure applying section and said reaction section of said first clamping member to selectively move said sections relative to each other against the bias of said at least one biasing member.

22. The method as defined in claim 20 wherein the contact members on said one surface of said at least one planar element are raised projections, and further characterized by providing a locator element between said substrate and said planar element, said locator element having openings therein corresponding to the said raised projections, with said raised projections projecting through said openings into electrical contact with the contact pads on said substrate.

23. The method as claimed in claim 22 further characterized by providing an interposer between said locator element and said substrate, said interposer having through vias therein corresponding to said contact pads of said substrate and said contact members of said planar element to thereby provide the electrical connections therebetween.

24. The invention as defined in claim 20 wherein there are planar elements on each side of said substrate.

25. The invention as defined in claim 22 wherein each planar element is an IC chip module.

26. The invention as defined in claim 20 wherein said at least one biasing member includes a belville washer.

27. The invention as defined in claim 20 wherein there are a plurality of circumferentially spaced biasing members.

28. The invention of claim 20 wherein said reaction section and said pressure applying section of said second clamping member are rigidly interconnected.

\* \* \* \* \*